US008665016B2

(12) United States Patent
Chowdhury et al.

(10) Patent No.: US 8,665,016 B2
(45) Date of Patent: Mar. 4, 2014

(54) SUPPLY TRACKING

(75) Inventors: Debopriyo Chowdhury, San Diego, CA (US); Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/534,669

(22) Filed: Jun. 27, 2012

(65) Prior Publication Data

US 2013/0285750 A1    Oct. 31, 2013

Related U.S. Application Data

(60) Provisional application No. 61/640,585, filed on Apr. 30, 2012.

(51) Int. Cl.
*H03G 3/20* (2006.01)
*H03F 1/22* (2006.01)
(52) U.S. Cl.
USPC ............................ 330/136; 330/127; 330/311

(58) Field of Classification Search
USPC .......... 330/10, 127, 136, 297, 311; 455/127.1
See application file for complete search history.

(56) References Cited

U.S. PATENT DOCUMENTS 5,936,464 A * 8/1999 Grondahl ...................... 330/136
7,860,467 B2 * 12/2010 Pan ............................ 455/127.1

* cited by examiner

*Primary Examiner* — Khanh V Nguyen
(74) *Attorney, Agent, or Firm* — Garlick & Markison; Randy W. Lacasse

(57) ABSTRACT

A power amplifier includes generation, tracking and usage of an envelope of an input RF signal. To improve upon the efficiency of the power amplifier, various configurations include using the tracked envelope, for example, an OFDM signal, to improve the average efficiency. Suitable hardware/software in the form of circuitry, logic gates, and/or code functions to generate and track an envelope of an input RF signal and modulate one or more of the input supply voltage, cascode gate bias or parallel PA branches using the tracked envelope.

20 Claims, 15 Drawing Sheets

SUPPLY TRACKING

CROSS REFERENCE TO RELATED PATENTS

The present application claims priority based on 35 USC 119 to the provisionally filed application entitled, COMMUNICATION SYSTEM TRANSCEIVERS, having Ser. No. 61/640,585, filed on Apr. 30, 2012, the contents of which are incorporated herein for any and all purposes, by reference thereto.

BACKGROUND OF THE INVENTION

1. Technical Field of the Invention

This invention relates generally to wireless communication and more particularly to processes and circuits used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

Disadvantages of conventional approaches will be evident to one skilled in the art when presented in the disclosure that follows.

BRIEF SUMMARY OF THE INVENTION

The technology described herein is directed to an apparatus and methods of operation that are further described in the following Brief Description of the Drawings and the Detailed Description of the Invention. Other features and advantages will become apparent from the following detailed description made with reference to the accompanying drawings.

BRIEF DESCRIPTION OF THE SEVERAL VIEWS OF THE DRAWING(S)

DETAILED DESCRIPTION OF THE INVENTION

Figure 1:
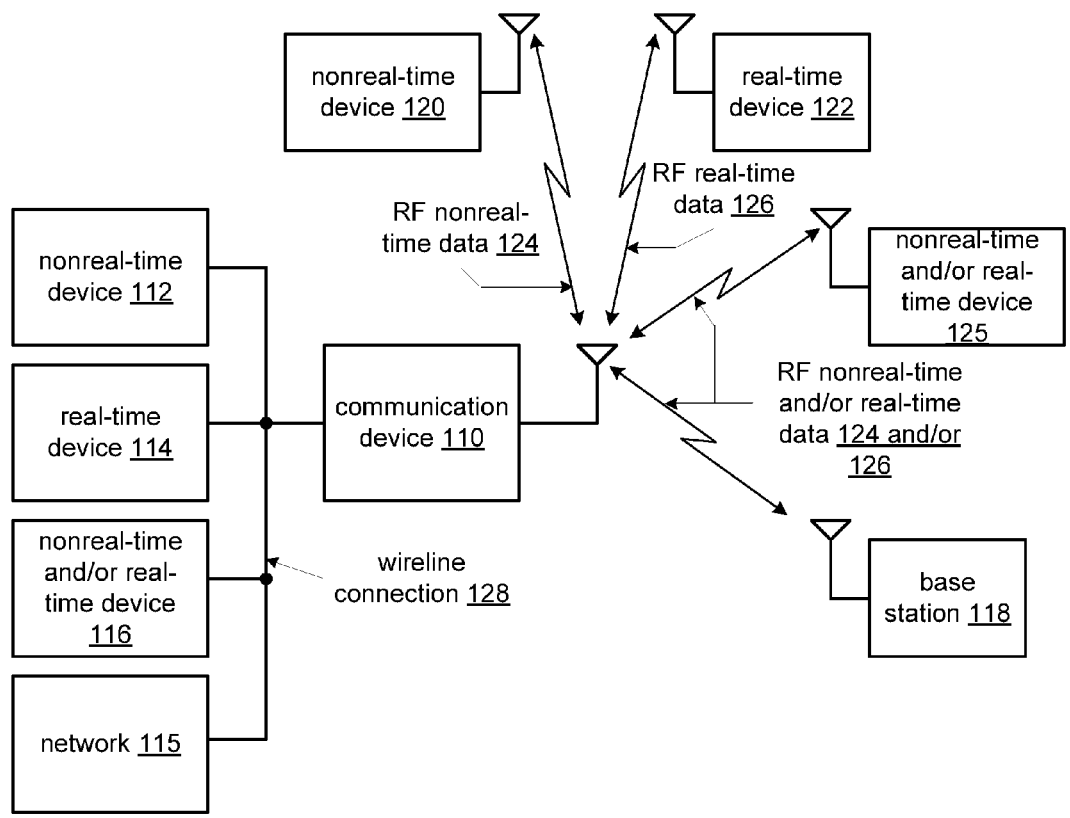
FIG. 1 is a schematic block diagram of an embodiment of a wireless communication system.

FIG. 1 is a schematic block diagram of a communication system in accordance with the technology described herein. In particular, a communication system is shown that includes a communication device 110 that communicates real-time data 126 and/or non-real-time data 124 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In an embodiment of the present invention, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the present invention. Such wireless transceivers shall be described in greater detail in association with FIGS. 5-15 that follow.

Figure 2:
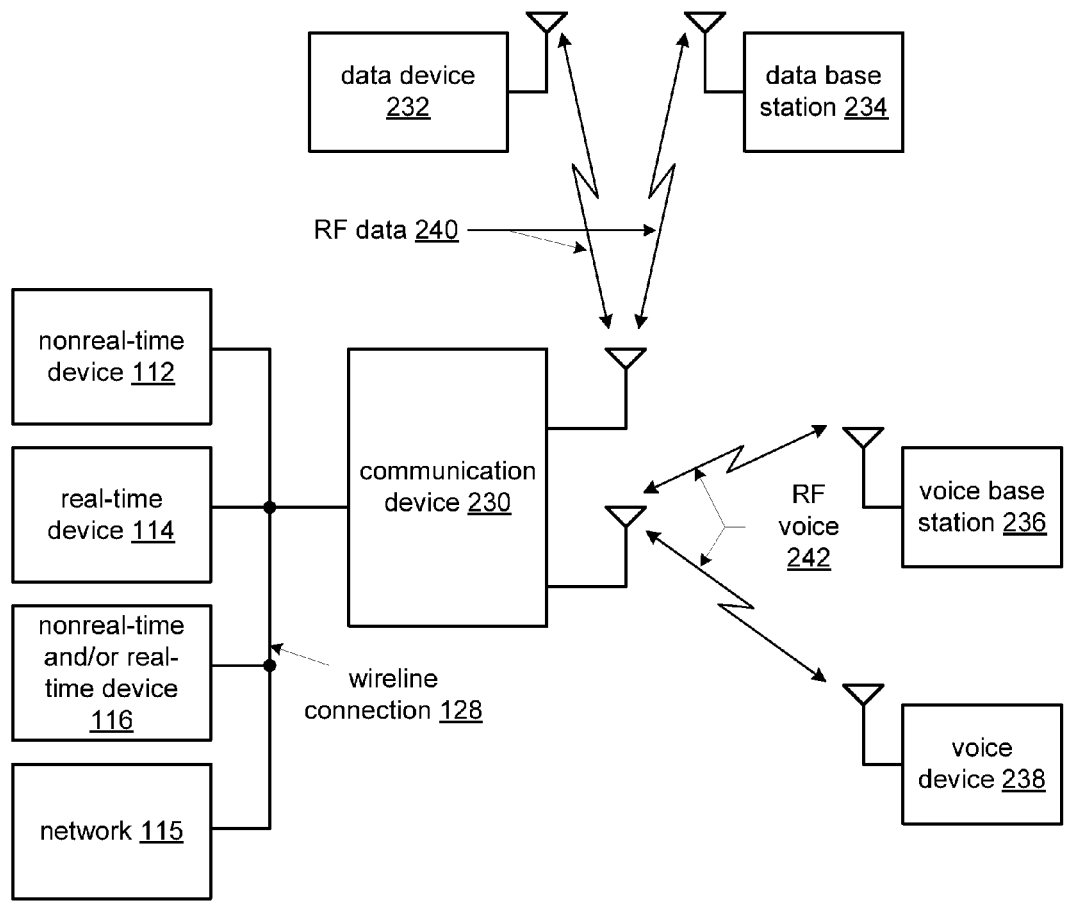
FIG. 2 is a schematic block diagram of another embodiment of a wireless communication system.

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
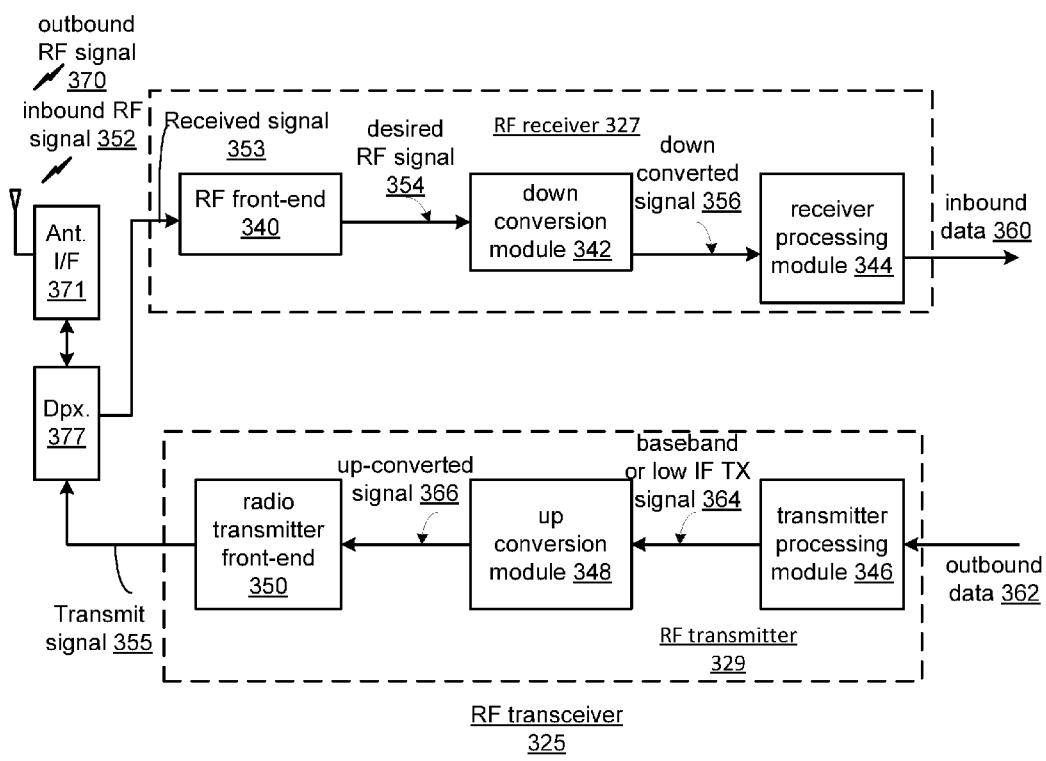
FIG. 3 is a schematic block diagram of an RF transceiver for a wireless communication system.

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time, real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
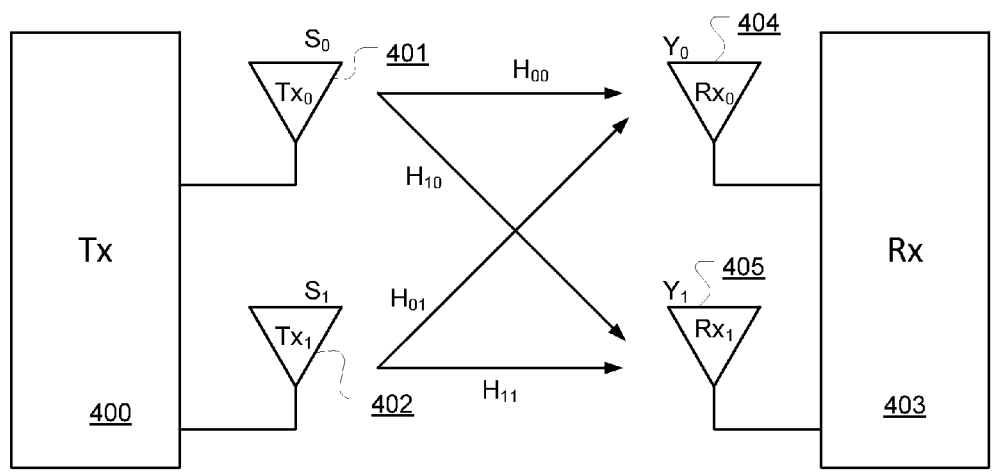
FIG. 4 is a schematic block diagram of a simple two antenna MIMO structure.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, and antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as separate Tx and Rx units for exemplary purpose in FIG. 4. That is, Tx unit 400 is transmitting data and Rx unit 403 is receiving the transmitted data. The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx\text{-}Rx}$ notation) and the data path is referred to as channel H. While, the example illustrated is a two antenna structure, the embodiments disclosed herein may operate within other known and future multi-antenna configurations (e.g., 2×4, 2×8, 4×16, etc.)

Further details including optional functions and features of the RF transceiver are discussed in conjunction with FIGS. 5-15 that follow.

Figure 5:
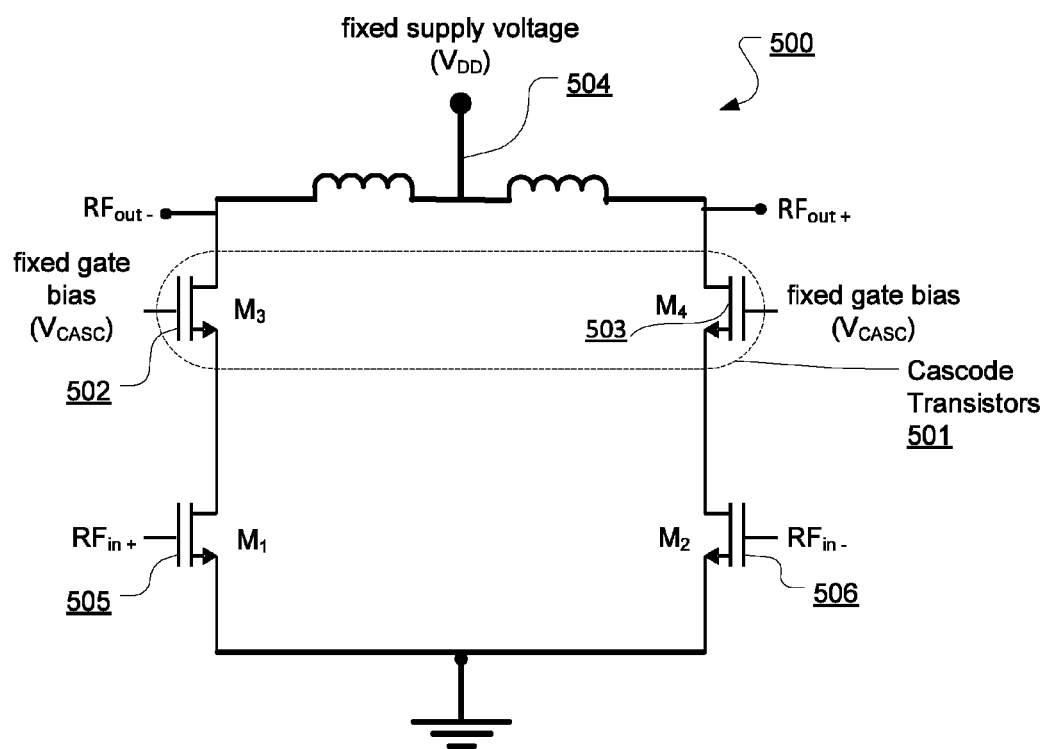
FIG. 5 illustrates one embodiment of a cascode integrated power amplifier (iPA) for a communication transceiver.

FIG. 5 illustrates an integrated power amplifier (iPA) for a communication transceiver. Power amplifier circuits are classified as A, B, AB and C for linear designs, and class D and E for switching designs. Class 'A' amplifiers are typically very inefficient, while class 'B' amplifiers typically fail to provide clean amplification. A good compromise is a class 'AB' amplifier. A class 'AB' amplifier is a class 'B' amplifier which has a small amount of 'bias' current flowing through the output transistors at all times. The bias current eliminates virtually all of the crossover distortion that's possible with class 'B' amplifiers. The bias current is flowing because output transistors are always conducting current (even without an input signal).

In class-AB operation, each device operates the same way as in class B over half the waveform, but also conducts a small amount on the other half. As a result, the region where both devices simultaneously are nearly off (the "dead zone") is reduced. The result is that when the waveforms from the two devices are combined, the crossover is greatly minimized or eliminated altogether. The exact choice of quiescent current, the standing current through both devices when there is no signal, makes a large difference to the level of distortion (and to the risk of thermal runaway, that may damage the devices); often the bias voltage applied to set this quiescent current has to be adjusted with the temperature of the output transistors.

As shown in FIG. 5, class AB power amplifier 500 may be arranged in a cascode configuration 501 of CMOS transistors. The cascode arrangement includes a first CMOS transistor 502 ($M_3$) and second CMOS transistor 503 ($M_4$). Input supply voltage 504 and cascode gate bias for transistors 502 and 503 are held fixed, independent of a transmitted envelope of an input RF signal. An RF signal to be amplified by the circuit is input ($RF_{in+}$) at CMOS transistor 505 ($M_1$) and likewise RF signal ($RF_{in-}$) input through CMOS transistor 506 ($M_2$). The amplified signal is output through $RF_{out+}/RF_{out-}$. However, for input RF signals with large dynamic range, like WLAN OFDM, this results in poor efficiency at average output power.

Figure 6:
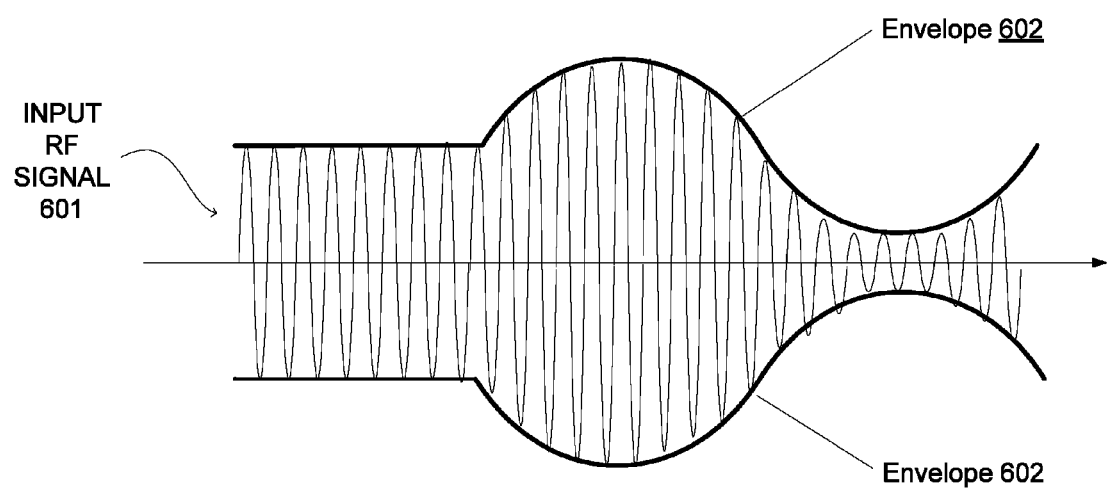
FIG. 6 illustrates basic envelope generation and tracking for an input RF signal.

It is desirable to improve upon the efficiency of the circuit shown in FIG. 5. Therefore, in the technology as described herein, various embodiments include using an envelope of an input RF signal, for example, an OFDM signal, to improve the average efficiency. As shown in FIG. 6, suitable hardware/software in the form of circuitry, logic gates, and/or code functions to generate and track envelope 602 of input RF signal 601. Envelope 602 represents the upper and lower boundaries of RF input signal 601. Tracked points along the envelope curve are synchronized in time with the corresponding points along the input signal.

Figure 7:
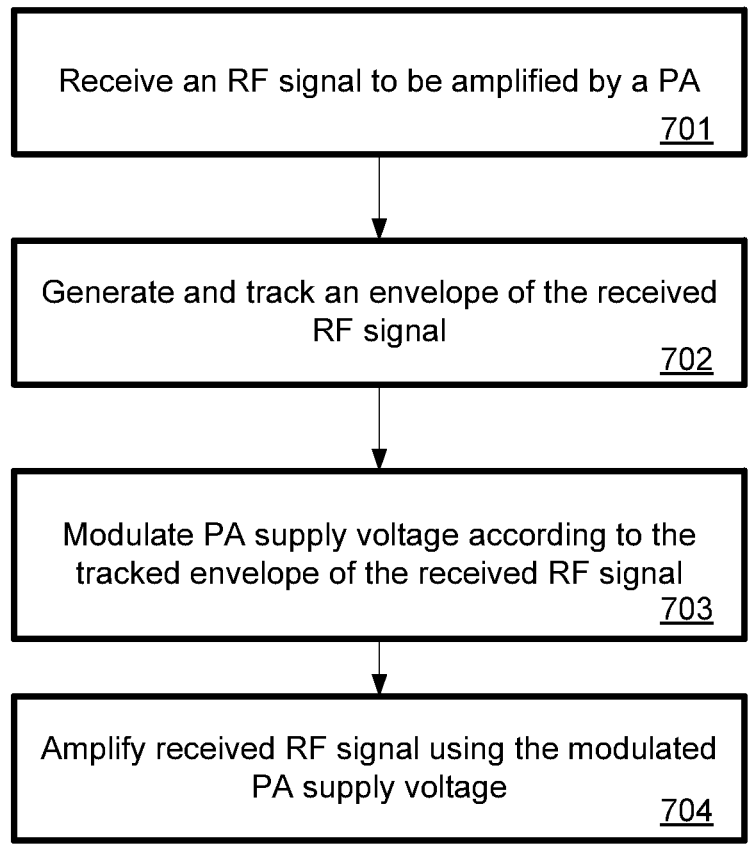
FIG. 7 illustrates a flow diagram of the technology described herein with envelope tracking for a power amplifier.

FIG. 7 illustrates a flow diagram of the technology described herein with use of envelope information for a power amplifier. In step 701, an RF signal to be amplified is received by the power amplifier. In step 702, using known envelope generating and tracking techniques, the envelope of the received RF signal is generated. In step 703, the generated envelope is used to modulate (i.e., instantaneously vary) the power amplifier (PA) supply voltage by tracking points on the envelope synchronized with the received RF signal, and in step 704, the power amplifier implementing the modulated supply voltage, amplifies the input RF signal.

Figure 8:
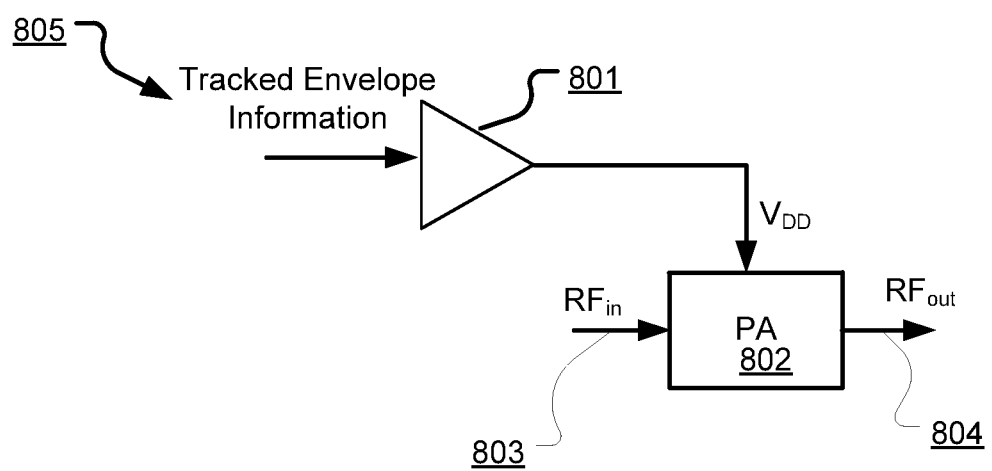
FIG. 8 illustrates an embodiment of a power amplifier with supply voltage modulation.

FIG. 8 illustrates an embodiment of the technology described herein which comprises suitable hardware/software in the form of circuitry, logic gates, and/or code that functions to integrate a supply modulator 801 with CMOS cascode power amplifier (PA) 802 for efficiency enhancement using supply voltage modulation. More specifically, supply voltage modulator 801 varies the $V_{DD}$ of integrated CMOS power amplifier 802 based on tracked envelope information 805 of an input RF (e.g., OFDM) signal 803. CMOS cascode power amplifier 802 amplifies RF input signal 803 using the supply modulated $V_{DD}$ producing amplified RF output signal 804. In addition, by integrating a supply voltage modulator with the actual CMOS PA on the same die, tighter control over impedances, etc. is achieved. Such a solution provides area/cost benefits of integrated PAs, along with the efficiency improvement of implemented envelope modulation.

Figure 9:
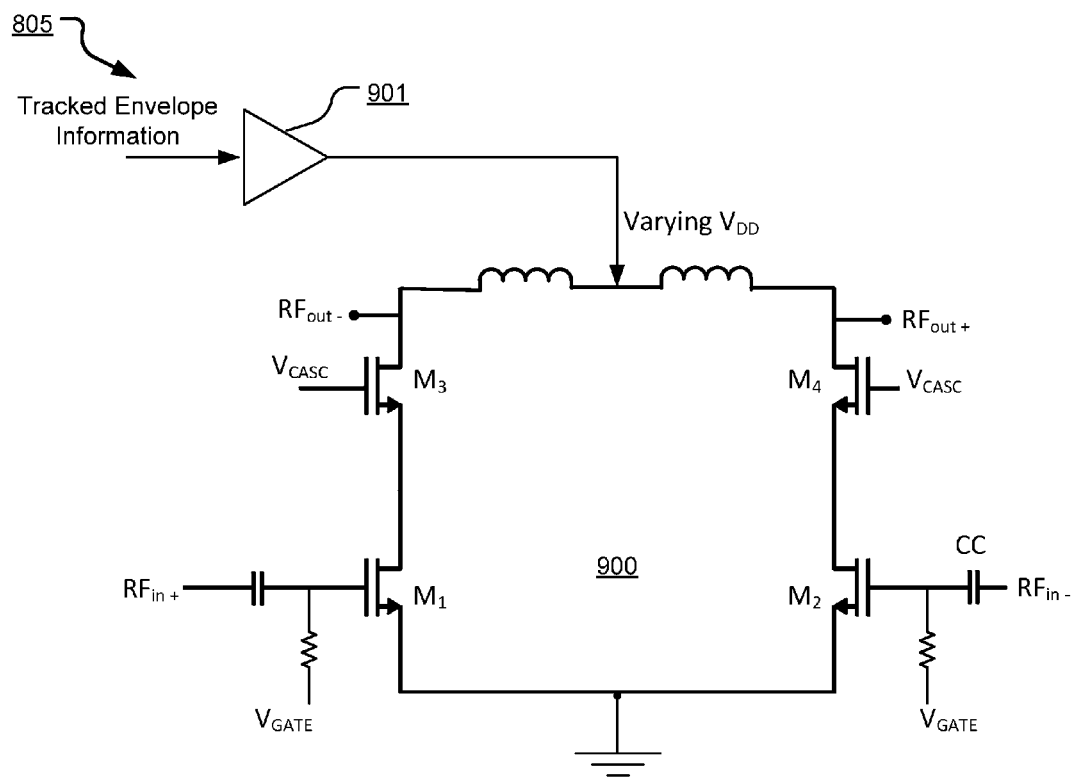
FIG. 9 illustrates another embodiment of a cascode power amplifier with supply voltage modulation.

FIG. 9 illustrates an embodiment of the technology described herein using a conventional cascode PA 900 of the configuration previously shown in FIG. 5 and additionally in FIG. 8 (802). In this embodiment, the heretofore described envelope generating and tracking (e.g., FIG. 6, etc.) techniques are used to modulate (instantaneously vary) the supply voltage 901 of the power amplifier. Hence, at any point in time, the $V_{DD}$ tracks the output swing (equivalent to transmitted power) and average efficiency is improved.

Figure 10:
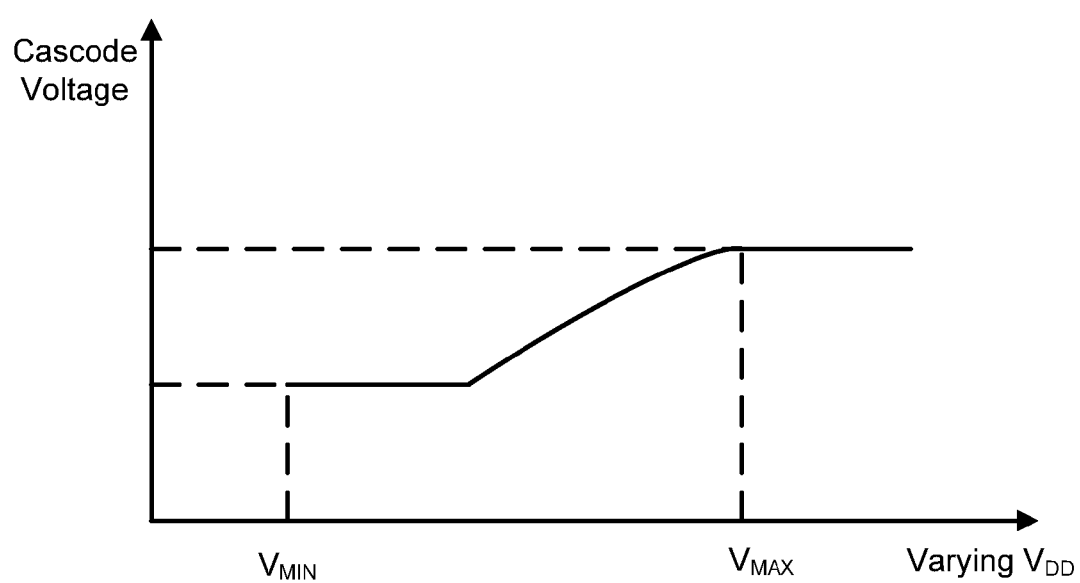
FIG. 10 illustrates one embodiment of an optimized supply voltage transfer function.

As shown FIG. 9, the envelope of the RF signal is used to vary the supply voltage of the CMOS cascode power amplifier instantaneously. However, in a cascode configuration employing a stack of two transistors as depicted here, the linearity and efficiency of the PA can be improved if the cascode gate voltage ($V_{CASC}$) is simultaneously modulated based on the envelope signal. If the cascode gate bias voltage is held fixed, then for low supply voltages, the top transistor may leave its desired operating regime, thereby negatively affecting output power, linearity and efficiency. In particular, it is claimed that for a given topology and device sizing, there exists an optimum cascode gate voltage profile that can help maximize efficiency, while not degrading linearity. FIG. 10 illustrates one such embodiment of an optimized supply transfer function. In this embodiment, a modulator synthesizes the optimum voltage for the cascode gate, based on the tracked envelope of the RF signal.

Figure 11:
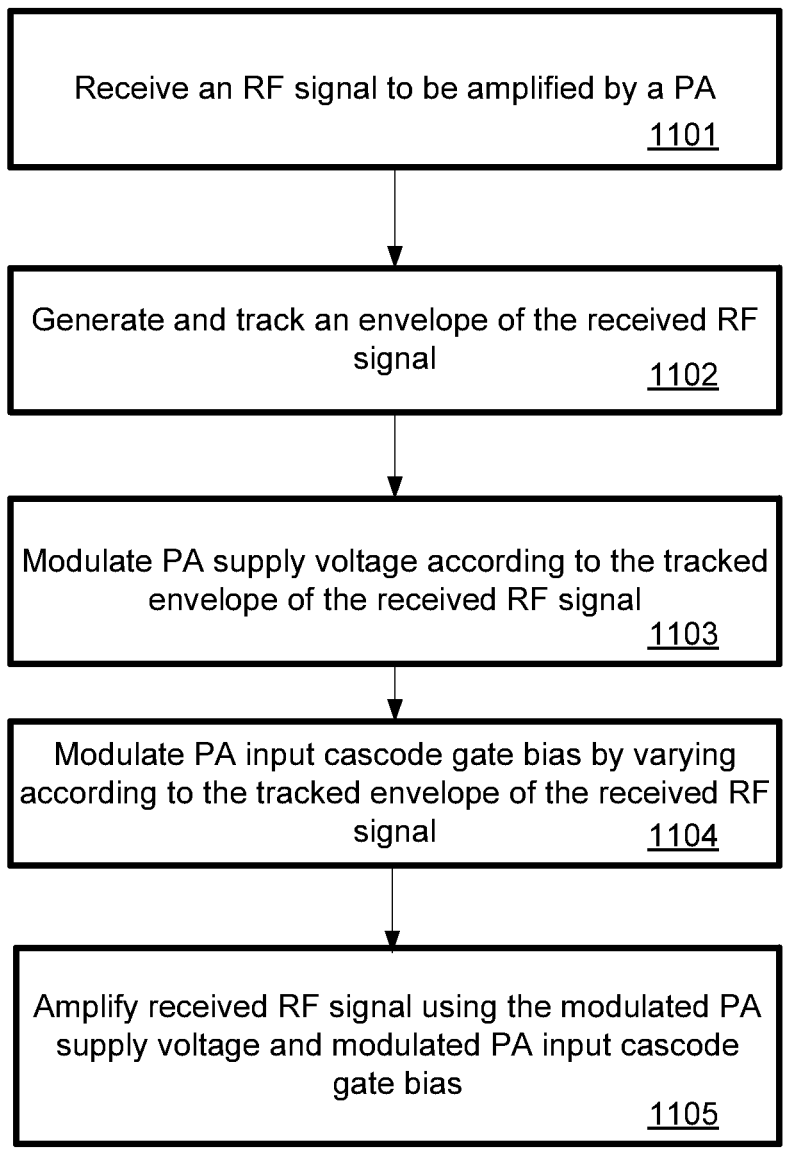
FIG. 11 illustrates another embodiment flow diagram of the technology described herein with envelope tracking for a power amplifier.

FIG. 11 illustrates a flow diagram of the technology described herein using envelope generation and tracking for a power amplifier. In step 1101, an RF signal to be amplified is received by the power amplifier. In step 1102, using previously described envelope generating techniques, the envelope of the received RF signal is generated. In step 1103, the generated envelope is used to modulate (i.e., instantaneously vary) the power amplifier (PA) supply voltage by tracking points on the envelope synchronized with the received RF signal. In step 1104, the tracked envelope is additionally used to modulate input cascode gate bias by varying in synchronism with tracked points on the same generated and tracked envelope, and in step 1105, the power amplifier implementing the modulated supply voltage in combination with the modulated input cascode gate bias, amplifies the input RF signal.

Figure 12:
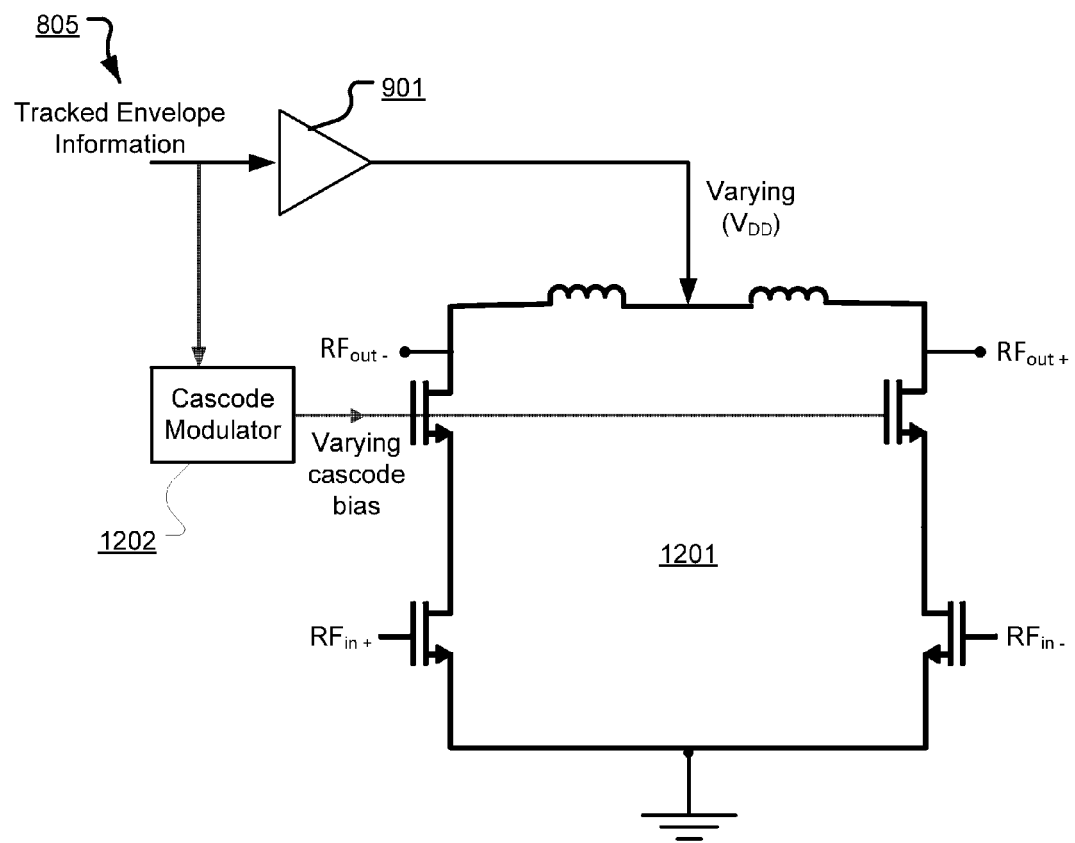
FIG. 12 illustrates one embodiment of a cascode power amplifier with supply voltage and cascode modulator.

FIG. 12 illustrates an embodiment of the technology described herein which comprises suitable hardware in the form of circuitry that functions to integrate a supply voltage modulator 901 and cascode modulator (input gate bias) 1202 with CMOS cascode power amplifier (PA) 1201 for efficiency enhancement using tracked RF envelope information. More specifically, supply voltage modulator 901 varies the $V_{DD}$ of integrated CMOS power amplifier 1201 based on a generated and tracked envelope 805 of an input RF (e.g., OFDM) signal ($RF_{in+-}$). In addition, CMOS cascode modulator 1202 varies input cascode gate bias of integrated CMOS power amplifier 1201 based on the same generated and tracked envelope 805. This will enable further improvement of efficiency while preserving output power and linearity. Also, by integrating a supply voltage and cascode modulator with the actual CMOS PA on the same die, a tighter control over impedances, etc. is achieved. Such a solution will provide the area/cost benefit of integrated PAs, along with the efficiency improvement of implemented envelope tracking.

Figure 13:
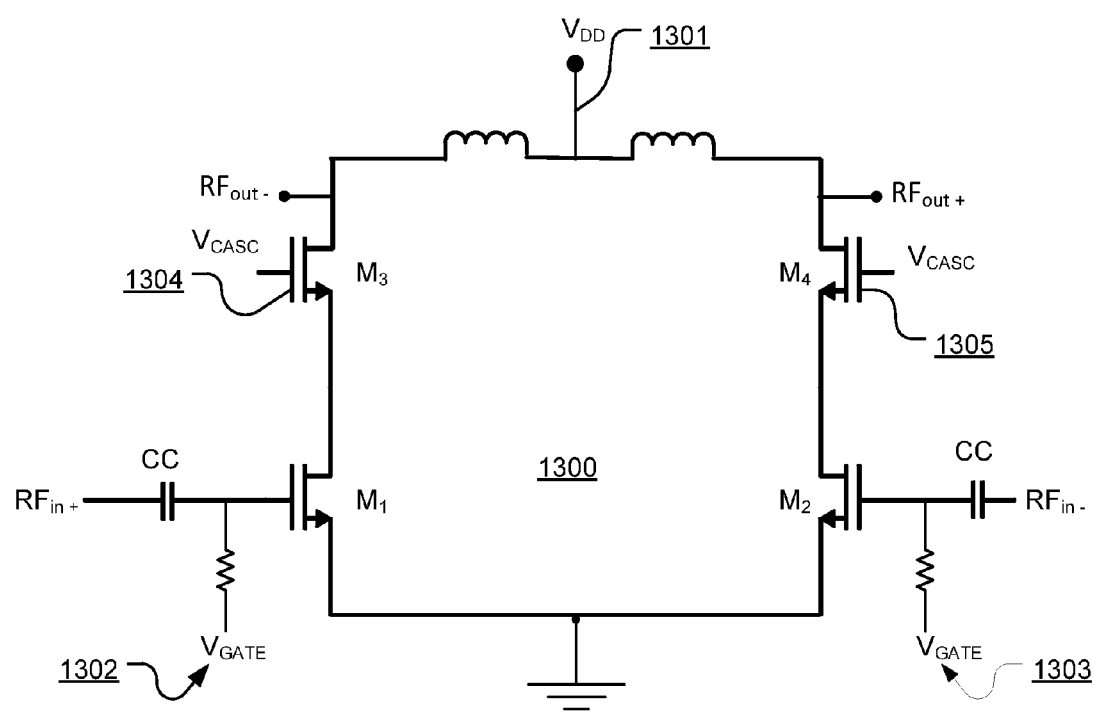
FIG. 13 illustrates one embodiment of a power amplifier.

FIG. 13 illustrates a conventional PA 1300 where supply voltage $V_{DD}$ 1301 is held fixed, and the gate bias of the input devices ($V_{GATE}$) 1302 and 1303 of the PA are also held constant. PA 1300 can be arranged in a cascode configuration of CMOS transistors. The cascode arrangement includes a first CMOS transistor 1304 ($M_3$) and second CMOS transistor 1305 ($M_4$). In this arrangement, the supply voltage 1301, cascode gate bias for transistors 1304 and 1305, and the gate bias of the input devices 1302 and 1303 are all held fixed, independent of a transmitted envelope of an input RF signal. However, for input RF signals with large dynamic range, like WLAN OFDM, this results in poor efficiency at average output power as per:

$$\text{Efficiency of } PA \propto \frac{\text{Output voltage}}{V_{DD}} \times \frac{\text{Output current}}{\text{Quiescent current}}$$

In high dynamic range systems, like WLAN employing OFDM, the peak efficiency of the PA may be high (>40%), but the average transmit efficiency is Very Low (<18%), due to the high peak-to-average ratio of the signal. At average power, output voltage is much less than $V_{DD}$ and output current is less than quiescent current, and therefore efficiency for PAs is significantly lower. This happens because both $V_{DD}$ and the quiescent current (determined by $V_{GATE}$) are held fixed, independent of the transmitted power.

While the use of supply voltage and cascode gate bias modulation improves the average efficiency, in some embodiments it may not address the issue of fixed quiescent current and any resulting efficiency degradation.

Figure 14:
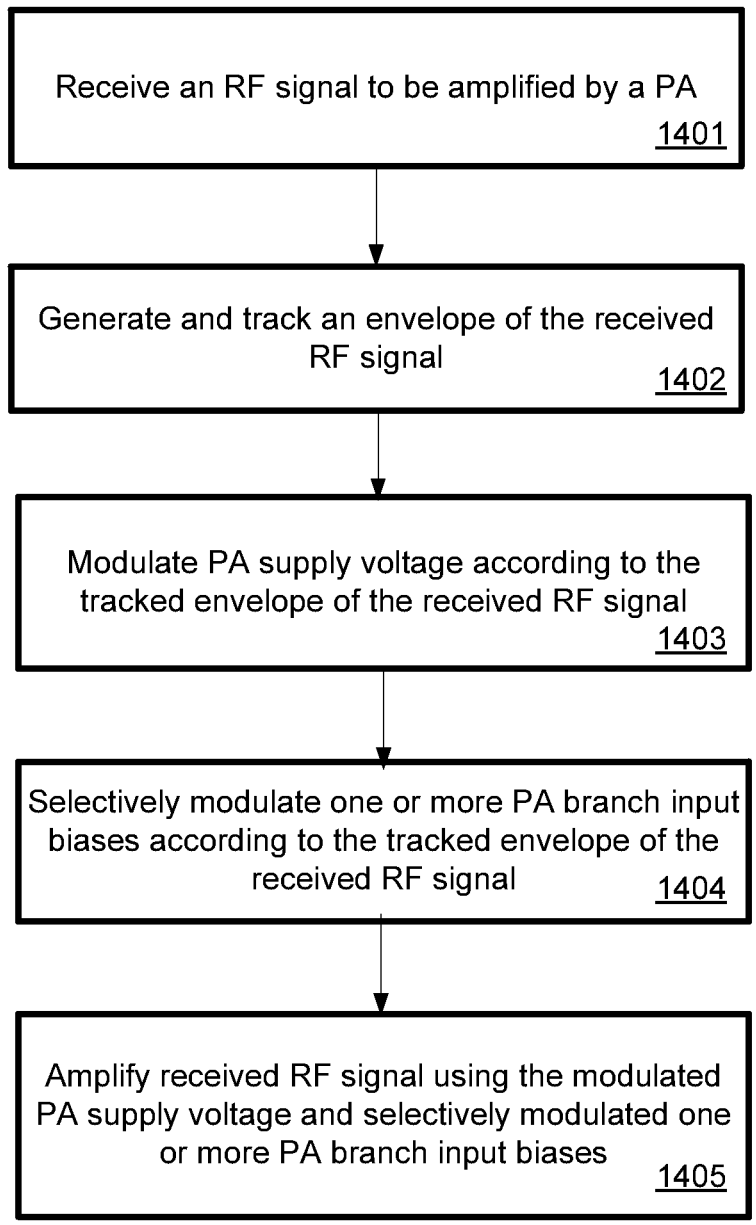
FIG. 14 illustrates another embodiment flow diagram of the technology described herein with envelope tracking for a power amplifier.

FIG. 14 illustrates an alternate embodiment flow diagram of the technology described herein using envelope generation and tracking for a power amplifier. In step 1401, an RF signal to be amplified is received by the power amplifier. In step 1402, using known envelope generation and tracking techniques, the envelope of the received RF signal is tracked. In step 1403, the tracked envelope is used to modulate (i.e., instantaneously vary) the power amplifier (PA) supply voltage. In step 1404, the tracked envelope is additionally used to selectively actuate one or more parallel PA branches by selective switching according to the tracked envelope. In step 1405, the power amplifier implementing the modulated supply voltage in combination with the selectively actuated one or more parallel PA branches, amplifies the input RF signal.

Figure 15:
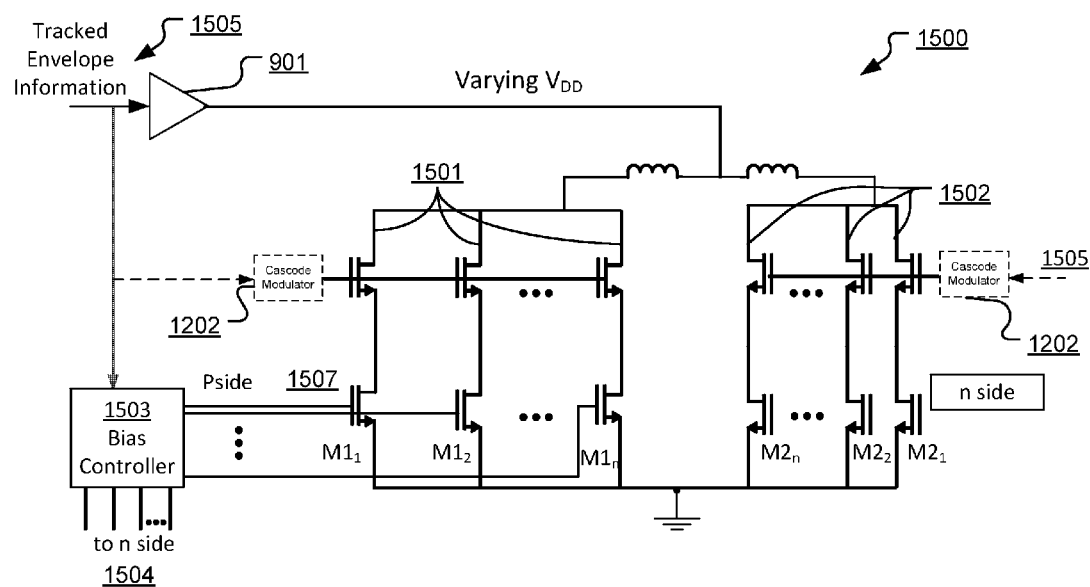
FIG. 15 illustrates an embodiment of a power amplifier with branch, supply voltage, and optional cascode modulation.

FIG. 15 illustrates an embodiment of the technology described herein which comprises suitable hardware in the form of circuitry that functions to selectively actuate parallel branches in combination with previously described supply envelope modulation techniques. In this scheme, the PA circuitry 1500 is split up into several parallel branches (1501-P side and 1502-N side). Bias controller block 1503 turns selective parallel branches on and off to substantially match a relative strength of the modulated (varied) supply voltage (according to tracked envelope information 1505). More specifically, in a high power region, when the $V_{DD}$ is high, all branches of the PA 1500 will be turned on, so quiescent current is high. As the power output reduces, the supply modulation 901 will lower $V_{DD}$. Simultaneously, a bias controller block 1503 will turn off an appropriate number of branches 1501/1502 through P side gate bias 1507 to CMOS transistors $M1_1$-$M1_n$ and $M2_1$-$M2_n$ (through N side gate bias 1504, actual connections not shown) of the PA to reduce its quiescent current envelope. Also, by integrating supply voltage and branch modulators (through selective bias control) with the actual CMOS PA on the same die, a tighter control over impedances etc. is achieved. Such a solution will provide the area/cost benefit of integrated PAs, along with the efficiency improvement of implemented envelope tracking.

By combining branch modulation with envelope based supply voltage modulation, the illustrated PA can maintain optimum load-line at all output powers, significantly saving power consumption.

In an alternative embodiment, cascode modulator block 1202, as previously described in association with FIG. 12, is also included to vary input cascode gate bias of integrated CMOS power amplifiers in branches 1501 and 1502 based on the same generated and tracked envelope 1505. By combining cascode, branch, and supply voltage modulation, the illustrated PA can maintain optimum load-line at all output powers, significantly saving power consumption. Also, as with the previous embodiments, the integration of the cascode, branch, and supply voltage modulators with the actual CMOS PA on the same die achieves tighter control over impedances, etc. Such a solution also provides area/cost benefits of integrated PAs, along with the efficiency improvement of implemented envelope modulation.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as CMOS, as one of ordinary skill in the art will appreciate, the transistors may be implemented using any type of transistor structure including, but not limited to, bipolar, field effect (FET) or metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

What is claimed is:

1. A communications power amplifier comprising:
   a cascode power amplifier;
   a supply voltage for the cascode power amplifier;
   an RF signal input to the cascode power amplifier;
   an envelope tracker, the envelope tracker generating and tracking an envelope associated with an RF signal received on the RF signal input;
   a supply voltage modulator connected to the supply voltage and the envelope tracker, the supply voltage modulator varying the supply voltage according to the tracked envelope associated with the RF signal received; and
   a cascode modulator varying cascode gate bias voltage according to the tracked envelope associated with the RF signal received.

2. The communications power amplifier, as per claim 1, wherein the cascode power amplifier comprises a CMOS cascode power amplifier.

3. The communications power amplifier, as per claim 1, further comprising the cascode modulator synthesizing an optimized transfer function for cascode gate bias voltage based on the tracked envelope associated with the RF signal received.

4. The communications power amplifier, as per claim 1, the cascode power amplifier further comprising a plurality of branches and an integrated branch modulator, the integrated branch modulator varying RF input gate bias voltage according to the tracked envelope associated with the RF signal received.

5. The communications power amplifier, as per claim 4, further comprising the integrated branch modulator varying the RF input gate bias voltage by dynamically selecting and actuating a number of branches of the plurality of branches of the cascode power amplifier.

6. The communications power amplifier, as per claim 1, further comprising any of: the supply voltage modulator, the cascode modulator, or an integrated branch modulator occupying a common die with the cascode power amplifier.

7. The communications power amplifier, as per claim 1, wherein the communications power amplifier is operative in any of: a transmitter, transceiver, user equipment transceiver, base station transceiver, LTE transceiver or MIMO transceiver.

8. A method to optimize cascode power amplifier efficiency, the method comprising:
   receiving an input RF signal to the cascode power amplifier,
   generating and tracking an envelope of the received input RF signal,
   modulating an input power supply voltage of the cascode power amplifier, the modulating step comprising varying the input power supply voltage according to the tracked envelope of the input RF signal;
   modulating a cascode gate bias voltage by varying the cascode gate bias voltage according to the tracked envelope of the input RF signal; and
   amplifying the received input RF signal using the cascode power amplifier with modulated input power supply and cascode gate bias voltages.

9. The method to optimize cascode power amplifier efficiency, as per claim 8, wherein the cascode power amplifier comprises a CMOS cascode power amplifier.

10. The method to optimize cascode power amplifier efficiency, as per claim 8, wherein the step of varying the cascode gate bias further comprises synthesizing an optimized transfer function for the cascode gate bias voltage based on the tracked envelope.

11. The method to optimize cascode power amplifier efficiency, as per claim 8, further comprising dynamically modulating an RF input gate bias voltage, the dynamically modulating of the RF input gate bias voltage step comprising varying the RF input gate bias voltage according to the tracked envelope of the input RF signal.

12. The method to optimize cascode power amplifier efficiency, as per claim 11, wherein the dynamically modulating the RF input gate bias voltage step comprises dynamically selecting and actuating a number of branches of the cascode power amplifier.

13. The method to optimize cascode power amplifier efficiency, as per claim 9, wherein the steps are operative in any of: a transmitter, transceiver, user equipment transceiver, base station transceiver, LTE transceiver or MIMO transceiver.

14. A cascode power amplifier circuit comprising:
   a supply voltage input;
   at least a first pair of transistors in cascode arrangement, each of the transistors sharing a common gate bias and connected to the supply voltage input;
   an RF signal input coupled to the at least a first pair of transistors in cascode arrangement;
   a supply modulator connected to the supply voltage input, the supply modulator varying the supply voltage according to an envelope associated with an RF signal received on the RF signal input; and
   a branch modulator varying branch gate bias voltage according to the envelope associated with the RF signal received.

15. The cascode power amplifier circuit, as per claim 14, further comprising a cascode modulator, the cascode modulator varying cascode gate bias voltage according to the envelope associated with the RF signal received.

16. The cascode power amplifier circuit, as per claim 14, wherein the branch modulator varies branch gate bias voltage for a plurality of selectively biased parallel branches.

17. The cascode power amplifier circuit, as per claim 16, wherein the branch modulator further includes the plurality of selectively biased parallel branches biased by a bias controller connected to the plurality of selectively biased parallel branches.

18. The cascode power amplifier circuit, as per claim 17, wherein the bias controller turns selective parallel branches on and off to substantially match a relative strength of the varied supply voltage.

19. The cascode power amplifier circuit, as per claim 14, operative in any of: a transmitter, transceiver, user equipment transceiver, base station transceiver, LTE transceiver or MIMO transceiver.

20. The cascode power amplifier circuit, as per claim 14, further comprising any of: the supply modulator and the branch modulator occupying a common die with the cascode power amplifier.

* * * * *